United States Patent
Guo et al.

(10) Patent No.: US 12,189,030 B2
(45) Date of Patent: Jan. 7, 2025

(54) SYSTEMS AND METHODS FOR LASER GENERATION BASED ON POLARIZED BEAMS

(71) Applicant: BEIJING VOYAGER TECHNOLOGY CO., LTD., Beijing (CN)

(72) Inventors: Yonghong Guo, Mountain View, CA (US); Youmin Wang, Mountain View, CA (US); Chao Wang, Mountain View, CA (US); Yue Lu, Mountain View, CA (US); Lingkai Kong, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 1009 days.

(21) Appl. No.: 17/152,773

(22) Filed: Jan. 19, 2021

(65) Prior Publication Data
US 2021/0165095 A1    Jun. 3, 2021

Related U.S. Application Data (63) Continuation of application No. PCT/US2019/056614, filed on Oct. 16, 2019.

(51) Int. Cl.
*G01S 7/00* (2006.01)
*G01S 7/481* (2006.01)
(Continued)

(52) U.S. Cl.
CPC ............ *G01S 17/10* (2013.01); *G01S 7/4817* (2013.01); *G01S 7/483* (2013.01); *G01S 17/931* (2020.01);
(Continued)

(58) Field of Classification Search
USPC ........................................................ 356/5.01
See application file for complete search history.

(56) References Cited

U.S. PATENT DOCUMENTS

| | | | |
|---|---|---|---|
| 7,202,985 B2 * | 4/2007 | Miyagawa | G02B 27/283 359/204.3 |
| 9,304,228 B2 * | 4/2016 | Nakamura | G02B 26/123 |
| (Continued) | | | |

FOREIGN PATENT DOCUMENTS

| | | | |
|---|---|---|---|
| CN | 101916964 A | | 12/2010 |
| CN | 207148444 U | * | 3/2018 |
| CN | 109445119 A | | 3/2019 |

OTHER PUBLICATIONS

International Search Report issued in corresponding International Application No. PCT/US2019/056614, mailed Feb. 5, 2020, 3 pages.
(Continued)

*Primary Examiner* — James R Hulka
(74) *Attorney, Agent, or Firm* — BAYES PLLC (57) ABSTRACT

Embodiments of the disclosure provide a laser beam generation system. The laser beam generation system includes a first laser chip configured to generate a first polarized laser beam and a second laser chip configured to generate a second polarized laser beam. The laser beam generation system also includes a polarizer configured to combine the first polarized laser beam and the second polarized laser beam to generate a third laser beam.

18 Claims, 4 Drawing Sheets

(51) Int. Cl.
*G01S 7/483* (2006.01)
*G01S 17/10* (2020.01)
*G01S 17/931* (2020.01)
*H01S 5/00* (2006.01)
*H01S 5/068* (2006.01)
*H01S 5/183* (2006.01)

(52) U.S. Cl.
CPC ........ H01S 5/0028 (2013.01); H01S 5/06821 (2013.01); H01S 5/183 (2013.01)

(56) References Cited

U.S. PATENT DOCUMENTS

| | | | |
|---|---|---|---|
| 9,735,550 B2* | 8/2017 | Takahashi | H04N 9/3152 |
| 2006/0139717 A1 | 6/2006 | Miyagawa | |
| 2009/0212769 A1* | 8/2009 | Stoica | G01R 33/032 |
| | | | 324/244.1 |
| 2011/0261456 A1 | 10/2011 | Raab | |
| 2011/0267671 A1* | 11/2011 | Peng | H01S 3/005 |
| | | | 359/341.1 |
| 2012/0106160 A1* | 5/2012 | Pushkarsky | B82Y 20/00 |
| | | | 372/28 |
| 2013/0070206 A1* | 3/2013 | Kazama | H04N 9/3144 |
| | | | 353/30 |
| 2014/0034817 A1 | 2/2014 | Nakamura et al. | |
| 2019/0086618 A1* | 3/2019 | Shastri | H01S 5/02469 |
| 2019/0190236 A1* | 6/2019 | Sundaram | H04B 10/1143 |
| 2019/0190619 A1* | 6/2019 | Sundaram | H04B 10/1143 |
| 2019/0237934 A1* | 8/2019 | Adachi | H04B 10/505 |
| 2019/0372304 A1* | 12/2019 | Lee | H01S 5/02476 |

OTHER PUBLICATIONS

Written Opinion of the International Searching Authority issued in corresponding International Application No. PCT/US2019/056614, mailed Feb. 5, 2020, 5 pages.

International Preliminary Report on Patentability issued in corresponding International Application No. PCT/US2019/056614, mailed Apr. 19, 2022, 6 pages.

* cited by examiner

SYSTEMS AND METHODS FOR LASER GENERATION BASED ON POLARIZED BEAMS

CROSS-REFERENCE TO RELATED APPLICATION

This application is a continuation of PCT Application No. PCT/US2019/056614, filed Oct. 16, 2019, the entire contents of which are expressly incorporated herein by reference.

TECHNICAL FIELD

The present disclosure relates to optical sensing devices such as a light detection and ranging (LiDAR) device, and more particularly, to laser generation in an optical sensing device by combining polarized laser beams.

BACKGROUND

Optical sensing systems such as LiDAR systems have been widely used in autonomous driving and producing high-definition maps. For example, a typical LiDAR system measures distance to a target by illuminating the target with pulsed laser light beams and measuring the reflected pulses with a sensor such as a photodetector. Differences in laser light return times and/or wavelengths and/or phase can then be used to make digital three-dimensional (3D) representations of the target. Because using a narrow laser beam as the incident light can map physical features with very high resolution, a LiDAR system is particularly suitable for applications such as sensing in autonomous driving and/or high-definition map surveys.

The sensing range of a typical LiDAR device normally relates to the intensity of the pulsed laser light beams used for illuminating the target. For example, to achieve a longer sensing range (e.g., detecting targets farther away from the LiDAR device), a higher intensity is normally needed. In addition, illuminating targets with laser light beams with higher intensity may increase the signal-to-noise ratio (SNR), thereby achieving higher sensing accuracy. To generate high-intensity laser light beams, however, is challenging because conventional laser sources used for generating high-intensity laser light beams also generate a large amount of heat during operation, which shortens their lifetimes comparing to generating only low-intensity laser light beams. Moreover, concentration of the large amount of heat generated would damage surrounding components within the LiDAR device. As a result, efforts for increasing the intensity of laser sources in a LiDAR device remain largely unsuccessful.

Embodiments of the present disclosure address the above problems by providing systems and methods for laser generation in an optical sensing system by combining polarized laser beams.

SUMMARY

Embodiments of the disclosure provide a laser beam generation system. The laser beam generation system includes a first laser chip configured to generate a first polarized laser beam and a second laser chip configured to generate a second polarized laser beam. The laser beam generation system also includes a polarizer configured to combine the first polarized laser beam and the second polarized laser beam to generate a third laser beam.

Embodiments of the disclosure also provide a method for controlling laser generation. The method includes generating a first polarized laser beam by a first laser chip and generating a second polarized second beam by a second laser chip. The method further includes combining the first polarized laser beam and the second polarized laser beam using a polarizer to generate a third laser beam.

Embodiments of the disclosure further provide an optical sensing device. The optical sensing device includes a laser beam generator, a scanner, and at least one photodetector. The laser beam generator includes a first laser chip configured to generate a first polarized laser beam, a second laser chip configured to generate a second polarized laser beam, and a polarizer configured to combine the first polarized laser beam and the second polarized laser beam to generate a third laser beam. The scanner is configured to scan a surrounding environment of the optical sensing device using the third laser beam. The at least one photodetector is configured to detect a returning laser beam reflected by an object in the surrounding environment.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

An optical sensing system such as a LiDAR system may use laser chips to generate pulsed laser beams for scanning a surrounding environment of the optical sensing system. For example, the laser chips may include a laser diode, a semiconductor device that can convert electrical energy into light, or other suitable laser generation devices. Laser beams (e.g., an array of photons) may be generated when electrons drop from a higher energy level to a lower one driven by a voltage. To increase the intensity of the generated laser beam, a higher voltage needs to be applied to the laser chip. This can lead to a large amount of heat generated within a concentrated area (e.g., at and/or around the laser chip) when the laser chip operates for a certain period of time. The heat can cause damage or deformation to the chip itself or other delicate components within the system, such as a Micro-Electro-Mechanical Systems (MEMS) scanner.

Embodiments of the present disclosure provide improved optical sensing systems that generate high-intensity laser beams by combining individual polarized laser beams. An exemplary system may include a printed circuit board that includes two laser chips, which may generate polarized laser beams that are combined to form another laser beam for LiDAR scanning.

In one example, a first and a second polarized laser beams respectively generated by the two laser chips may be combined to generate a third laser beam that has the intensity substantially equal to the sum of the intensities of the first and second polarized laser beams. For example, the intensity of the third laser beam may be equal to or higher than 75% of the sum of the intensities of the first and second laser beams, such as 75%, 80%, 85%, 90%, 95%, 100%, or within any range defined by these values, to be considered as "substantially equal to" the sum of the intensities of the first and second laser beams. In this way, each of the two laser chips used for generating the individual laser beams that are then combined into the laser beam used for LiDAR scanning (e.g., the third laser beam) may have a relatively lower intensity rating than the intensity rating of a single laser chip that would otherwise be required to provide a similar intensity to the combined laser beam. The relatively lower intensity rating can lead to less heat generation during operation.

In another example, the two laser chips may alternately generate the first and second laser beams, respectively, at different time slots. For example, the first laser chip may generate the first laser beam at the $1^{st}, 3^{rd}, 5^{th}, 7^{th}, 9^{th} \ldots$ time slots, where the second laser chip may generate the second laser beam at the $2^{nd}, 4^{th}, 6^{th}, 8^{th}, 10^{th} \ldots$ time slots. In this way, the first and second laser beams may be combined in a time-division manner. The intensity of the third laser beam may be substantially equal to an average of the intensities of the first and second polarized laser beams. Because the two laser chips can be turned on to emit laser beams alternately, the working time of each of the first and the second laser chips is reduced, thereby reducing heat generation. Thus, instead of using a single laser chip to operate continuously, two laser chips can be turned on alternately, each generating less heat than the single laser chip. When the two laser chips are arranged, for example, spatially apart from each other, the heat concentration issue can be better managed, thereby improving the lifetime of each individual laser chip.

In any case, the amount of heat generated by each of the two laser chips may be reduced while maintaining the intensity of the combined laser beam used for LiDAR scanning. In another example, the intensity of the laser beam used for LiDAR scanning may be further increased by combining the laser beams generated by two laser chips while maintaining the level of heat generated by each individual laser chip.

Figure 1:
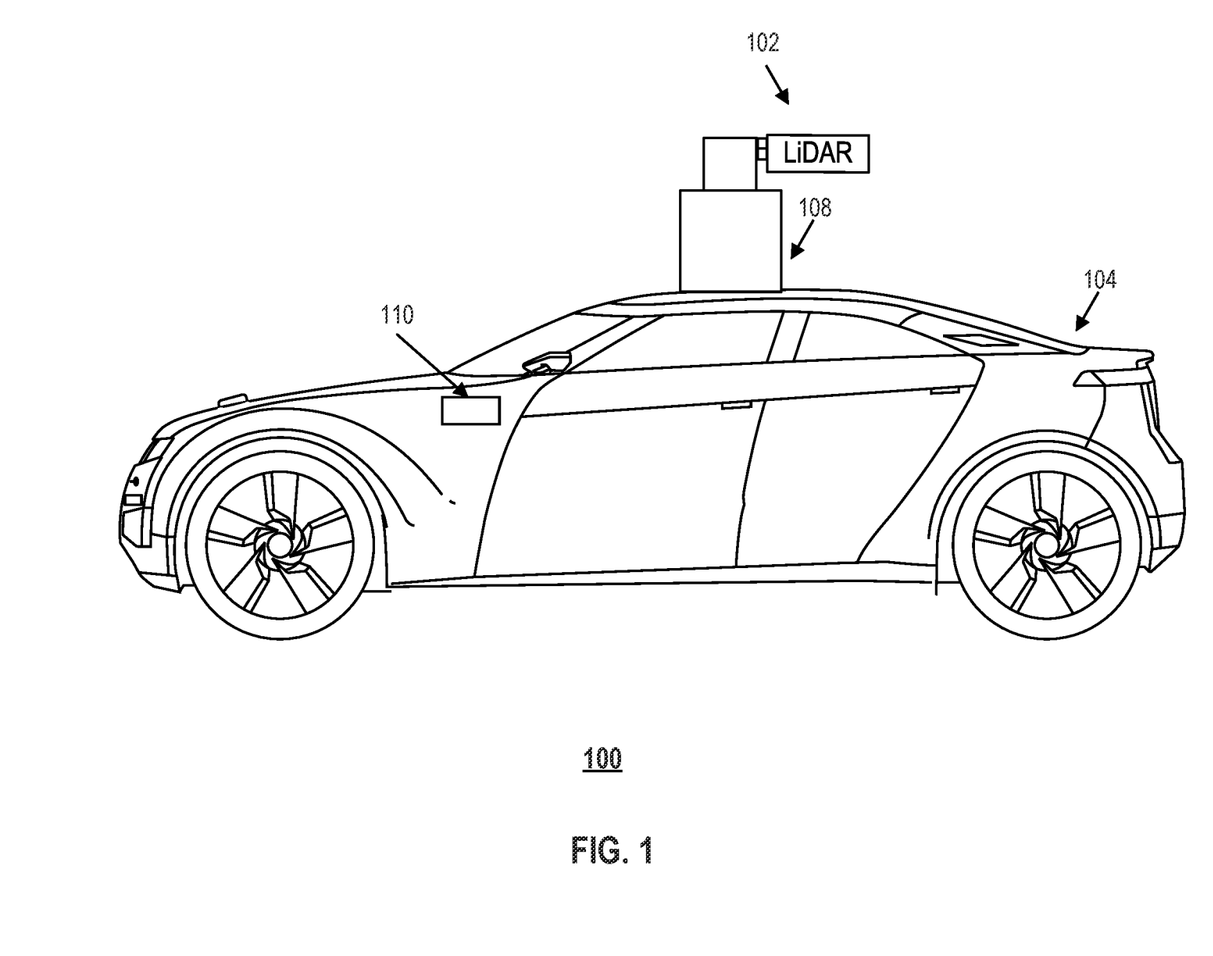
FIG. 1 illustrates a schematic diagram of an exemplary vehicle equipped with a LiDAR optical sensing system, according to embodiments of the disclosure.

FIG. 1 illustrates a schematic diagram of an exemplary vehicle 100 equipped with a LiDAR optical sensing system 102 (or LiDAR system 102 for simplicity), according to embodiments of the disclosure. Consistent with some embodiments, vehicle 100 may be an autonomous driving vehicle or a survey vehicle configured for acquiring data for constructing a high-definition map or perform city modeling.

As illustrated in FIG. 1, vehicle 100 may be equipped with LiDAR system 102 mounted to a body 104 via a mounting structure 108. Mounting structure 108 may be an electromechanical device installed or otherwise attached to body 104 of vehicle 100.

It is contemplated that vehicle 100 may be an electric vehicle, a fuel cell vehicle, a hybrid vehicle, or a conventional internal combustion engine vehicle. Vehicle 100 may have body 104 and at least one wheel as illustrated in FIG. 1. Body 104 may be any body style, such as a sports vehicle, a coupe, a sedan, a pick-up truck, a station wagon, a sports utility vehicle (SUV), a minivan, or a conversion van. In some embodiments, vehicle 100 may include a pair of front wheels and a pair of rear wheels, as illustrated in FIG. 1. However, it is contemplated that vehicle 100 may have more or less wheels or equivalent structures that enable vehicle 100 to move around. Vehicle 100 may be configured to be all wheel drive (AWD), front wheel drive (FWR), or rear wheel drive (RWD). In some embodiments, vehicle 100 may be configured to be operated by an operator occupying the vehicle, remotely controlled, and/or autonomous.

In some embodiments of the present disclosure, mounting structure 108 may use screws, adhesives, or another mounting mechanism. Vehicle 100 may be additionally equipped with a sensor 110 inside or outside body 104 using any suitable mounting mechanisms. Sensor 110 may include sensors used in a navigation unit, such as a Global Positioning System (GPS) receiver and one or more Inertial Measurement Unit (IMU) sensors. It is contemplated that the manners in which LiDAR system 102 or sensor 110 can be equipped on vehicle 100 are not limited by the example shown in FIG. 1 and may be modified depending on the types of LiDAR system 102, sensor 110, and/or vehicle 100 to achieve the desirable sensing performance.

Consistent with some embodiments, LiDAR system 102 and sensor 110 may be configured to capture data as vehicle 100 moves along a trajectory. For example, a transmitter of LiDAR system 102 may be configured to scan the surrounding environment and acquire 3D data (e.g., point cloud data). LiDAR system 102 may include one or more LiDAR sensing devices configured to measure distance to a target by illuminating the target with pulsed laser beams and measuring the reflected pulses with a receiver. The laser beams used by LiDAR system 102 may be ultraviolet, visible, or ear ed. As vehicle 100 moves along the trajectory, LiDAR system 102 may continuously capture data. Each set of data captured at a certain time range is known as a data frame.

Figure 2:
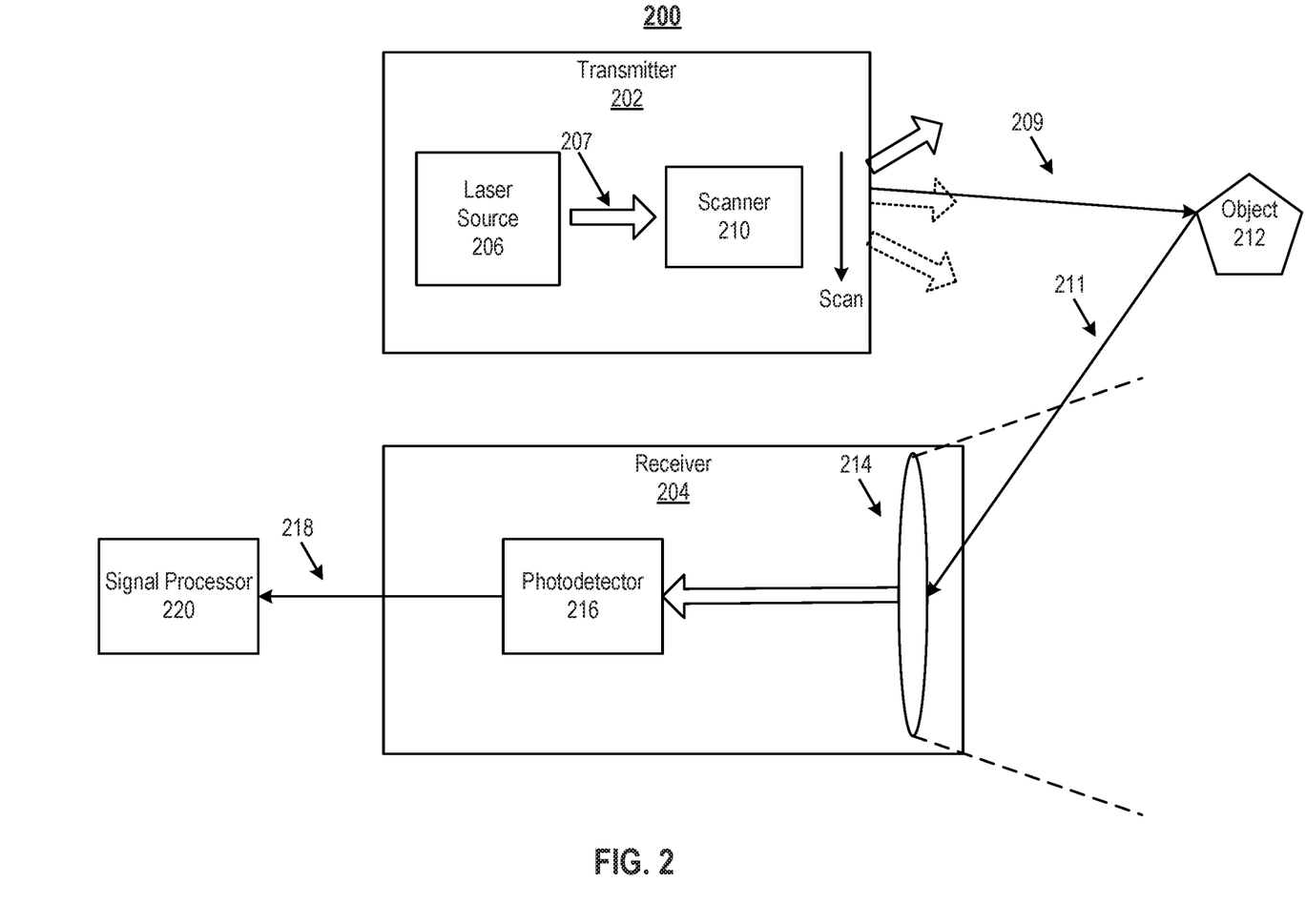
FIG. 2 illustrates a block diagram of an exemplary LiDAR optical sensing device having a transmitter and a receiver, according to embodiments of the disclosure.

FIG. 2 illustrates a block diagram of an exemplary LiDAR optical sensing device 200 (or LiDAR device 200 for simplicity), such as that used in LiDAR system 102. LiDAR device 200 may include a transmitter 202 and a receiver 204. Transmitter 202 may emit laser beams within a scan angle as it moves (e.g., rotates, swings, etc.). Transmitter 202 may include one or more laser sources 206 and a scanner 210. In some embodiments, laser source 206 and scanner 210 may be separate devices or components. In other embodiments, laser source 206 and scanner 210 may be integrated as a single device/component.

In some embodiments, transmitter 202 can sequentially emit a stream of pulsed laser beams in different directions within its scan angle as it moves (e.g., rotates, swings, etc.), as illustrated in FIG. 2. Laser source 206 may be configured to provide a laser beam 207 (also referred to as a "native laser beam") in a respective incident direction to scanner 210. In some embodiments, laser source 206 may be disposed within scanner 210 or integrated with scanner 210 (e.g., scanner 210 forms a rotator for scanning the surrounding environment). In some embodiments of the present disclosure, laser source 206 may generate a pulsed laser beam in the ultraviolet, visible, or near infrared wavelength range.

In some embodiments of the present disclosure, laser source 206 may include a pulsed laser diode (PLD), a vertical-cavity surface-emitting laser (VCSEL), a fiber laser, etc. For example, a PLD may be a semiconductor device similar to a light-emitting diode (LED) in which the laser beam is created at the diode's junction. In some embodiments of the present disclosure, a PLD includes a PIN diode in which the active region is in the intrinsic (I) region, and the carriers (electrons and holes) are pumped into the active region from the N and P regions, respectively. Depending on the semiconductor materials, the wavelength of incident laser beam 207 provided by a PLD may be smaller than 1,100 nm, such as 405 nm, between 445 nm and 465 nm, between 510 nm and 525 nm, 532 nm, 635 nm, between 650 nm and 660 nm, 670 nm, 760 nm, 785 nm, 808 nm, or 848 nm. It is understood that any suitable laser source may be used as laser source 206 for emitting laser beam 207.

Scanner 210 may be configured to emit a laser beam 209 to an object 212 in a first direction. In some embodiments, laser beam 209 may be the same as laser beam 207 when a scanner (e.g., a MEMS scanner) is not used or when a rotator scanner is integrated with laser source 206. Object 212 may include a wide range of materials including, for example, non-metallic objects, rocks, rain, chemical compounds, aerosols, clouds and even single molecules. The wavelength of laser beam 209 may vary based on the composition of object 212. In some embodiments, at each time point during the scan, scanner 210 may emit laser beam 209 to object 212 in a direction within the scan angle by rotating a micromachined mirror assembly. In some embodiments of the present disclosure, scanner 210 may include optical components (e.g., lenses, mirrors, etc.) that can focus pulsed laser light into a narrow laser beam to increase the scan resolution and the range to scan object 212.

In some embodiments, receiver 204 may be configured to detect a returned laser beam 211 returned from object 212. The returned laser beam 211 may be in a different direction from laser beam 209. Receiver 204 can collect laser beams returned from object 212 and output electrical signal reflecting the intensity of the returned laser beams. Laser light can be reflected by object 212 via backscattering, such as Rayleigh scattering, Mie scattering, Raman scattering, and fluorescence. As illustrated in FIG. 2, receiver 204 may include a lens 214 and a photodetector 216. Lens 214 may be configured to collect light from a respective direction in its field of view (FOV). At each time point during the scan, returned laser beam 211 may be collected by lens 214. Returned laser beam 211 may be returned from object 212 and may have the same wavelength as laser beam 209.

Photodetector 216 may be configured to detect returned laser beam 211 returned from object 212. In some embodiments, photodetector 216 may convert a laser light (e.g., returned laser beam 211) collected by lens 214 into an electrical signal 218 (e.g., a current or a voltage signal). Electrical signal 218 may be generated when photons are absorbed in a photodiode included in photodetector 216. In some embodiments of the present disclosure, photodetector 216 may include a PIN detector, a PIN detector array, an avalanche photodiode (APD) detector, a APD detector array, a single photon avalanche diode (SPAD) detector, a SPAD detector array, a silicon photomultiplier (SiPM/MPCC) detector, a SiP/MPCC detector array, or the like.

While scanner 210 is described herein as part of transmitter 202, it is understood that in some embodiments, scanner 210 can also be included in receiver 204, e.g., before photodetector 216 in the light path. The inclusion of scanner 210 in receiver 204 can improve photodetector 216's ability to capture returned laser beam 211 from desired directions, thereby reducing the interference caused by other light sources, such as the sun and/or other LiDAR systems. In addition, the aperture of receiver 204 may be increased to increase the sensitivity of photodetector 216.

In some embodiments, LiDAR device 200 may include a signal processor 220 configured to process electrical signal 218. For example, signal processor 220 may include an analog to digital converter to convert electrical signal 218 that may be an analog signal to a digital signal. In another example, signal processor 220 may include one or more filters, noise reducers, signal enhancer, or the like to improve the signal-to-noise ratio (SNR) of electrical signal 218. Signal processor 220 may include a microprocessor, a digital signal processor (DSP), a microcontroller, a field programmable gate array (FPGA), and/or other suitable devices or chips capable of processing electrical signal 218.

Figure 3:
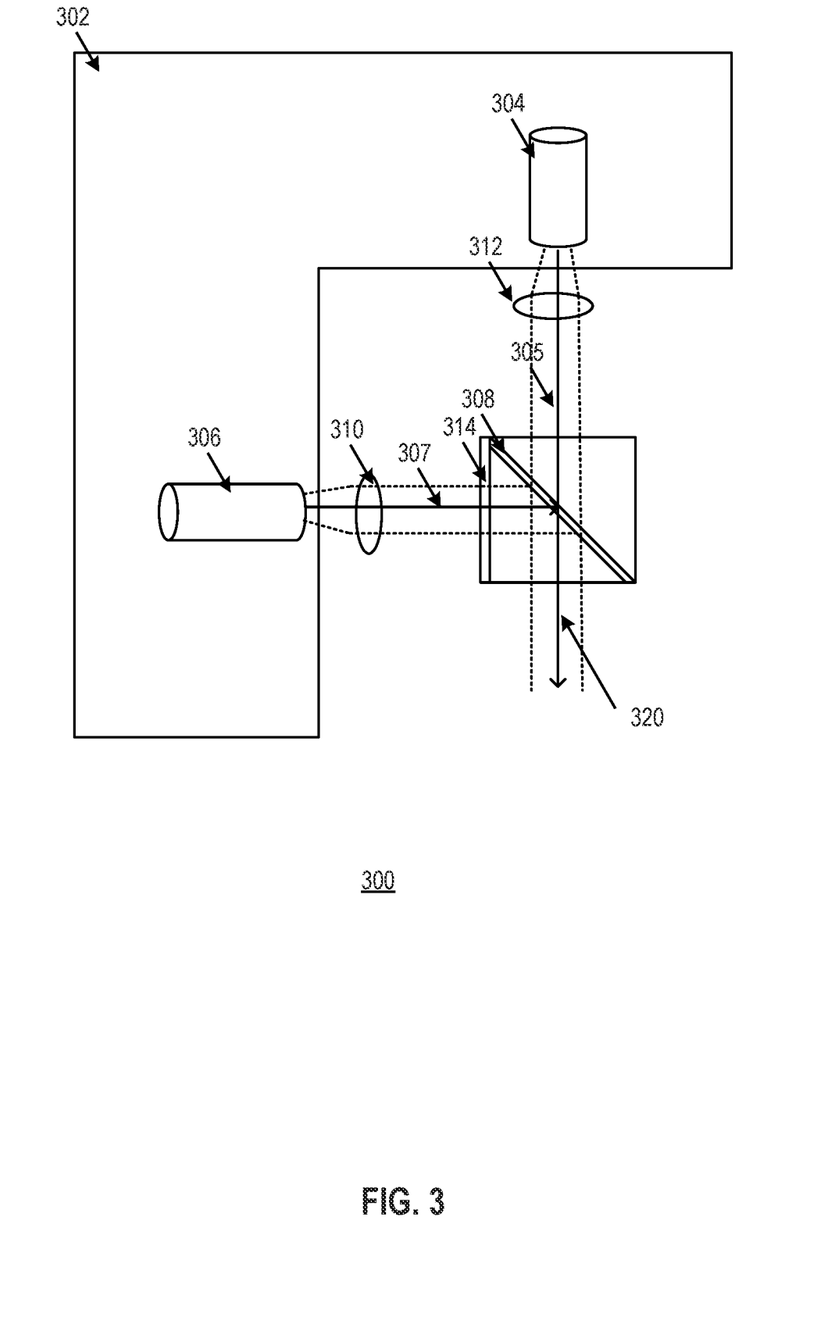
FIG. 3 illustrates a circuit diagram of an exemplary laser beam generation system, according to embodiments of the disclosure.

FIG. 3 illustrates a circuit diagram of an exemplary laser beam generation system 300, according to embodiments of the disclosure. In some embodiments, laser beam generation system 300 may be part of laser source(s) 206 in FIG. 2 that provide laser beams for LiDAR sensing/scanning. Different from a typical laser generator where only one laser chip (e.g., a laser diode) is used for generating scanning laser beams, laser beam generation system 300 utilizes two laser chips to generate the scanning laser beams. As discussed above, in one example, a first and a second laser chip can generate a first laser beam and a second laser beam simultaneously. The first and second laser beams can then be combined to form a third laser beam for sensing/scanning. The intensity of the combined laser beam can be substantially equal to the intensities of the first laser beam and the second laser beam respectively generated by the first laser chip and the second laser chip. In another example, the first laser chip and the second laser chip may alternately generate the first laser beam and the second laser beam at different time slots. The first and the second laser beams can be combined in a time-division manner to form a third laser beam, which can be used as the scanning laser beam. Therefore, as used herein, the term "combine" includes both combination in intensity (e.g., combing two simultaneously on laser beams) and combination in time (e.g., combing two alternately on laser beams).

As illustrated in FIG. 3, laser beam generation system 300 may include a printed circuit board (PCB) 302, a first laser chip 304, a second laser chip 306, and a polarizer 308. In some embodiments, printed circuit board 302 may be a board that has one or more etched sheet layers (e.g., layers with etched conductive tracks, pads, and/or other suitable conductive features) disposed on a non-conductive substrate. Electrical components such as first laser chip 304 and second laser chip 306 may be disposed on an etched sheet layer and may be mechanically supported and electrically connected by the etched sheet layer. In some embodiments, printed circuit board 302 may include a ceramic material (e.g., a ceramic board), where the ceramic material may include non-oxide ceramics such as aluminum nitride (AlN), oxide ceramics such as aluminum oxide ($Al_2O_3$), or other suitable high thermal conductive materials. By using high thermal conductive materials such as ceramics, heat generated by first and second laser chips 304 and 306 may be dissipated quickly during operation. Because heat toleration ability may limit the power level applied to a laser chip, which in turn relates to the intensity of the laser generated by the laser chip, improving heat dissipation may permit generation of higher-intensity laser beams.

It is contemplated that first and second laser chips 304 and 306 are not limited to be disposed on the same printed circuit board. For example, in some embodiments, first and second laser chips 304 and 306 may be disposed on separate printed circuit boards, which may be functionally coupled to each other through wired or wireless connections.

In some embodiments, first laser chip 304 and second laser chip 306 may include a semiconductor device such as a laser diode that converts electrical energy into laser light. For example, first laser chip 304 and second laser chip 306 may generate double heterostructure laser, quantum well laser, quantum cascade laser, interbond cascade laser, separate confinement heterostructure laser, distributed Bragg Reflector laser, distributed feedback laser, vertical-cavity surface-emitting laser, vertical-external-cavity surface-emitting-laser, and/or external-cavity diode laser.

In some embodiments, first laser chip 304 and/or second laser chip 306 may be configured to generate polarized laser beams. For example, a first polarized laser beam (e.g., first laser beam 305) may be generated by first laser chip 304. A second polarized laser beam (e.g., second laser beam 307) may be generated by second laser chip 306. In some embodiments, first laser beam 305 may include laser in a first polarized state and second laser beam 307 may include laser in a second polarized state. For example, the first and second polarized states may include two orthogonal linear polarization states such as P polarized state and S polarized state. The P polarized state refers to a light state in which the electric field of the polarized light is parallel to a plane of incidence. The S polarized state refers to a light state in which the electric field of the polarized light is perpendicular to the plane of incidence. In another example, the first and second polarized states may include other orthogonal linear polarization states different from the P-S polarized states.

In some embodiments, the first polarization state may include a situation where the electric field of first polarized laser beam 305 has a component that is in the same direction as a first reference direction, such as the direction parallel to the plane of incidence as in the case of the P polarized state. For example, the electric field of first laser beam 305 may be at an angle smaller than 90 degree with respect to the first reference direction, such as at 0 degree, 10 degrees, 20 degrees, 30 degrees, 45 degrees, 50 degrees, or 60 degrees. Similarly, the second polarization state may include a situation where the electric field of second polarized laser beam 307 has a component that is in the same direction as a second reference direction, such as the direction perpendicular to the plane of incidence as in the case of the S polarized state. For example, the electric field of second laser beam 307 may be at an angle smaller than 90 degree with respect to the second reference direction, such as at 0 degree, 10 degrees, 20 degrees, 30 degrees, 45 degrees, 50 degrees, or 60 degrees.

In some embodiments, polarizer 308 may include any suitable linear polarizer such as a transmissive-reflective polarizer. For example, polarizer 308 may include a plurality of thin wires arranged parallel to each other. A polarized laser that is polarized along these wires is reflected while a polarized laser that is polarized perpendicular to these wires is transmitted. In another example, polarizer 308 may use Brewster's angle where when the angle of incidence is at a specific value (e.g., Brewster's angle), S-polarized laser beams will be reflected and P-polarized laser beams will be transmitted. In the example illustrated in FIG. 3, the incidence angle of first laser beam 305 and/or its polarized state may be configured/controlled such that first laser beam 305 can be transmitted through polarizer 308. Similarly, the incidence angle of second laser beam 307 and/or its polarized state may be controlled/configured such that second laser beam 307 can be reflected by polarizer 308.

The intensity of the light transmitted through polarizer 308 may be calculated according to the Malus' law:

$$I = I_0 \cos^2 \theta \quad (1)$$

where $I_0$ is the intensity of the incident polarized laser beam, I is the intensity of the transmitted polarized laser beam and $\theta$ is the angle between the incident linear polarization and the polarization axis.

The degree of polarization or polarization efficiency of polarizer 308 may be calculated as:

$$P = \frac{(T_1 - T_2)}{(T_1 + T_2)} \quad (2)$$

where $T_1$ and $T_2$ are the principal transmittances of the polarizer. $T_1$ is the maximum transmission of polarizer 308 which occurs when the axis of polarizer 308 is parallel to the plane of polarization of the incident polarized laser beam. $T_2$ is the minimum transmission of polarizer 308 and occurs when the axis of polarizer 308 is perpendicular to the plane of polarization of the incident polarized beam.

The transmitted portion of first laser beam 305 can be combined with the reflected portion of laser beam 307 to form a combined laser beam 320. Laser beam 320 may be used to perform LiDAR scanning/sensing as discussed above.

It is contemplated that the angles of incidence for first and second laser beams 305 and 307 are not limited to the angles of incidence illustrated in FIG. 3. The layout illustrated in FIG. 3 is only for illustrative purposes. The exact angles of incidence for first and second laser beams 305 and 307 can be determined by a skilled artisan based on the polarized state of first and second laser beams 305 and 307, the type and parameters of polarizer 308, and the principles disclosed herein.

In some embodiments, laser beam generation system 300 may include collimating lens 310 and 312. First and second laser beams 305 and 307 respectively generated by first laser chip 304 and second laser chip 306 may disperse upon leaving first and second laser chips 304 and 306. Collimating lens 310 and 312 may be configured to collimate (e.g., parallelize) first and second laser beams 305 and 307, respectively.

In some embodiments, laser beam generation system 300 may include a waveplate 314 configured to change the laser in the second laser beam 307 from the second polarized state to a third polarized state. In some embodiments, waveplate 314 may be constructed out of a birefringent material (such as quartz or mica). By controlling the thickness of the birefringent material, waveplate 314 may be configured to be a half-wave plate where the polarization direction of the laser beam passing through waveplate 314 is shifted to another direction, e.g., perpendicular to the polarization direction of the laser beam before it reaches waveplate 314. In some embodiments, waveplate 314 may be an optical device configured to select certain polarizations of light, discarding the other polarizations. The selection may be realized by retarding (or delaying) one component of polarization with respect to its orthogonal component.

In some embodiments, waveplate 314 may be disposed between second laser chip 306 and polarizer 308 such that the polarization state of second laser beam 307 may be changed before second laser beam 307 reaches polarizer 308 (e.g., from P polarized state to S polarized state). In this way, laser beams reaching polarizer 308 can have different polarization states for transmission and reflection even if first and second laser chips 304 and 306 emit laser beams having the same polarization state. For example, first laser beam 305 may be P polarized and laser beam 307 may also be P polarized after generated by first and second laser chips 304 and 306, respectively. Waveplate 314 may change the polarization of laser beam 307 from P to S. As a result, the S polarized second laser beam 307 after passing through waveplate 314 may be reflected by polarizer 308, while the P polarized first laser beam 305 may be transmitted through polarizer 308. In this way, the reflected laser beam 307 and transmitted first laser beam 305 may be combined to form a combined laser beam.

When both first and second laser chips 304 and 306 are turned on to simultaneously emit laser beams 305 and 307, respectively, the combined laser beam (e.g., laser beam 320) may have an intensity substantially equal to the sum of the intensity of first laser beam 305 and the intensity of second laser beam 307. When first and second laser chips 304 and 306 are turned on alternately (e.g., in different time slots), the combined laser beam 320 may have an intensity substantially equal to an average of the intensity of first laser beam 305 and the intensity of second laser beam 307 provided that the duty cycles of both laser chips are roughly the same.

Figure 4:
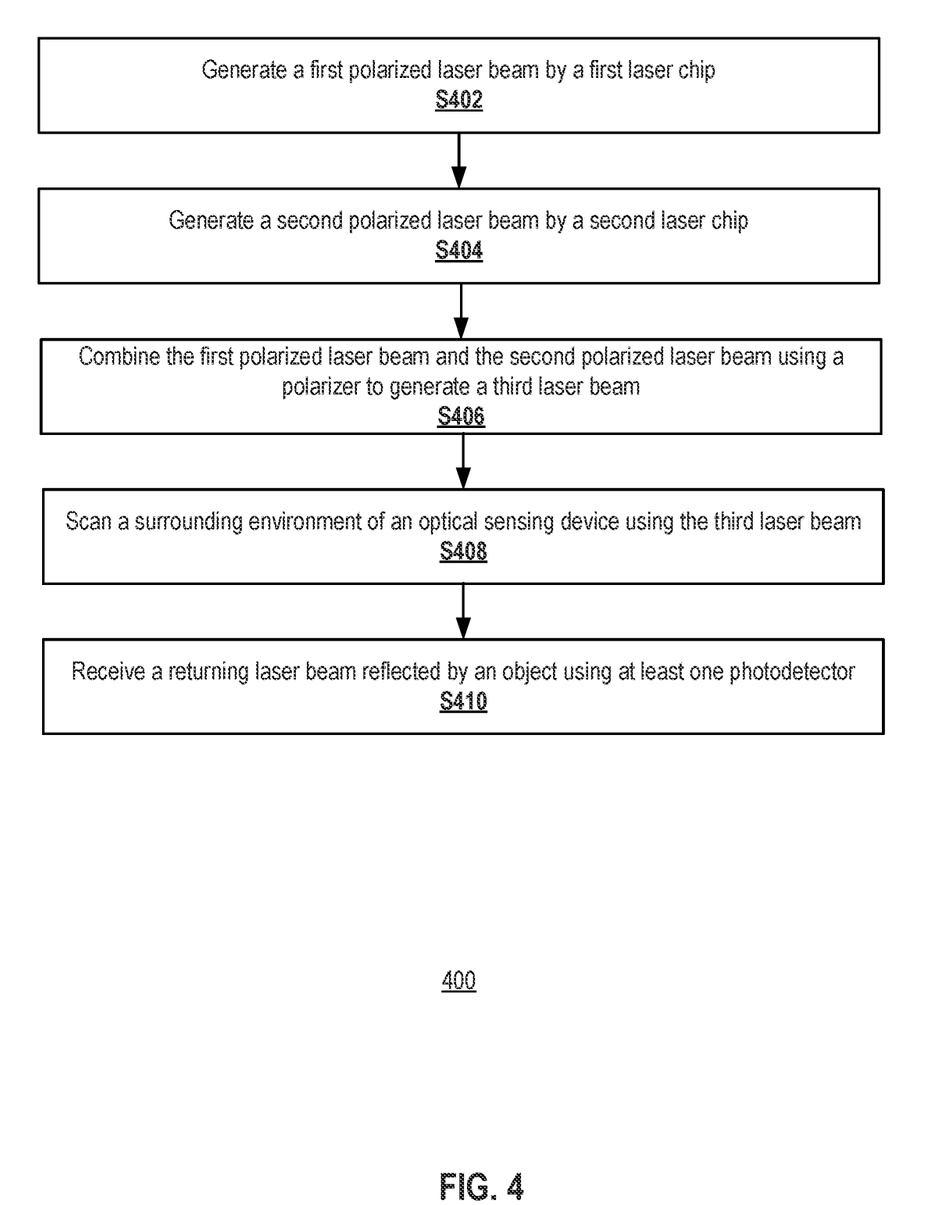
FIG. 4 illustrates a flow chart of an exemplary method for controlling laser generation, according to embodiments of the disclosure.

FIG. 4 illustrates a flow chart of an exemplary method 400 for controlling laser generation, according to embodiments of the disclosure. In some embodiments, method 400 may be implemented by LiDAR system 102 or optical sensing device 200 having laser beam generation system 300. It is to be appreciated that some of the steps in method 400 may be optional, while additional steps may be inserted. Further, some of the steps of method 400 may be performed simultaneously, or in an order different from the example shown in FIG. 4.

Consistent with some embodiments, in steps S402 and S404, a first and a second polarized laser beam are generated by a first laser chip (e.g., first laser chip 304) and a second laser chip (e.g., second laser chip 306), respectively.

In step S406, the first and the second polarized laser beams (e.g., laser beams 305 and 307) may be combined using a polarizer (e.g., polarizer 308) to generate a third laser beam (e.g., laser beam 320). As discussed above, the third laser beam may have an intensity substantially equal to the sum of the intensities of the first and second laser beams when the first and second laser chips simultaneously emit the first and second laser beams. The third laser beam may have an intensity substantially equal to an average of the intensities of the first and second laser beams when the first and second laser chips alternately emit the first and second laser beams (e.g., in different time slots).

In some embodiments, the first and the second laser beams (e.g., laser beams 305 and 307) may be collimated by collimating lens (e.g., collimating lens 312 and 310) before being combined by a polarizer (e.g., polarizer 308). As discussed above, the collimating lens may be configured to collimate (e.g., parallelize) the laser beams that may become disperse after being emitted by the respective laser chips.

In some embodiments, at least one of the first or the second polarized laser (e.g., laser beam 307 shown in FIG. 3) may be directed to pass through a waveplate (e.g., waveplate 314) to change its polarization state. By manipulating the polarization state, combination of the laser beams at the polarizer (e.g., polarizer 308) may be performed with more flexibility. For example, it would not be required to use laser chips have specific parameters to generate laser beams having particular polarization states. Rather, the polarization states can be adjusted after the laser beams are generated but before reaching the polarizer.

In step S408, the combined laser beam (e.g., laser beam 320) may be used to scan a surrounding environment of an optical sensing device (e.g., optical sensing device 200). The combined laser beam may have enhanced intensity to reach a longer range and/or to achieve a higher SNR. In another example, a heat generation may be reduced thanks to the distributed manner of laser chip arrangement, as well as the high thermal conductive material(s) used in constructing the PCB that hosts the laser chip(s).

In step S410, a photodetector (e.g., photodetector 216) may receive a laser beam reflected by an object (e.g., object 212). The photodetector may convert the optical signal contained in the reflected laser beam into an electrical signal (e.g., electrical signal 218). As discussed above, using laser beams with increased intensity may also increase the SNR of the reflected optical signal, thereby increasing the SNR of the electrical signal. Moreover, reducing heat generation may also improve the sensitivity of the photodetector, thereby improving the SNR of the electrical signal generated by the photodetector.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:
1. A laser beam generation system, comprising:
 a first laser chip configured to generate a first polarized laser beam;
 a second laser chip configured to generate a second polarized laser beam;
 a polarizer configured to combine the first polarized laser beam and the second polarized laser beam to generate a third laser beam; and
 a printed circuit board (PCB),
  wherein the PCB is formed in an L-shape with a first portion extending in a first direction and a second portion extending in a second direction perpendicular to the first direction,
  wherein the first laser chip is disposed on the first portion such that the first polarized laser beam is emitted in a direction parallel to the second direction,
  wherein the second laser chip is disposed on the second portion such that the second polarized laser beam is emitted in a direction parallel to the first direction, and
  wherein the first and second laser chips are configured to generate the first and second polarized laser beams, respectively, at different time slots.
2. The laser beam generation system of claim 1, wherein:
 the first polarized laser beam comprises laser in a first polarization state;
 the second polarized laser beam comprises laser in a second polarization state; and
 the polarizer is configured to transmit the laser in the first polarization state and reflect the laser in the second polarization state.
3. The laser beam generation system of claim 1, wherein:
 the first polarized laser beam comprises laser in a first polarization state;
 the second polarized laser beam comprises laser in a second polarization state;

the laser beam generation system comprises a waveplate configured to change the laser in the second polarized laser beam from the second polarization state to a third polarization state; and the polarizer is configured to transmit the laser in the first polarization state and reflect the laser in the third polarization state.

4. The laser beam generation system of claim 1, wherein the first and second laser chips are turned on in the different time slots alternatively associated with respective duty cycles.

5. The laser beam generation system of claim 4, wherein the duty cycles associated with the first and second laser chips respectively are roughly the same.

6. The laser beam generation system of claim 1, wherein an intensity of the third laser beam is substantially equal to an average of intensities of the first and second polarized laser beams.

7. The laser beam generation system of claim 1, wherein the PCB comprises a ceramic material.

8. The laser beam generation system of claim 1, comprising at least one collimating lens configured to parallelize the first polarized laser beam or the second polarized laser beam.

9. A method for controlling laser generation, comprising:
generating a first polarized laser beam by a first laser chip disposed on a printed circuit board (PCB);
generating a second polarized laser beam by a second laser chip disposed on the PCB; and
combining the first polarized laser beam and the second polarized laser beam using a polarizer to generate a third laser beam,
wherein the PCB is formed in an L-shape with a first portion extending in a first direction and a second portion extending in a second direction perpendicular to the first direction,
wherein the first laser chip is disposed on the first portion such that the first polarized laser beam is emitted in a direction parallel to the second direction,
wherein the second laser chip is disposed on the second portion such that the second polarized laser beam is emitted in a direction parallel to the first direction, and
wherein the first and second polarized laser beams are generated at different time slots.

10. The method of claim 9, wherein:
the first polarized laser beam comprises laser in a first polarization state;
the second polarized laser beam comprises laser in a second polarization state; and
the method comprises:
transmitting, by the polarizer, the laser in the first polarization state; and
reflecting, by the polarizer, the laser in the second polarization state.

11. The method of claim 9, wherein:
the first polarized laser beam comprises laser in a first polarization state;
the second polarized laser beam comprises laser in a second polarization state; and
the method comprises:
changing, by a waveplate, the laser in the second polarized laser beam from the second polarization state to a third polarization state;
transmitting, by the polarizer, the laser in the first polarization state; and
reflecting, by the polarizer, the laser in the third polarization state.

12. The method of claim 9, wherein the first and second laser chips are turned on in the different time slots alternatively associated with respective duty cycles.

13. The method of claim 12, wherein the duty cycles associated with the first and second laser chips respectively are roughly the same.

14. The method of claim 9, wherein an intensity of the third laser beam is substantially equal to an average of intensities of the first and second polarized laser beams.

15. An optical sensing device, comprising:
a laser beam generator, comprising:
a first laser chip configured to generate a first polarized laser beam;
a second laser chip configured to generate a second polarized laser beam;
a polarizer configured to combine the first polarized laser beam and the second polarized laser beam to generate a third laser beam; and
a printed circuit board (PCB);
a scanner configured to scan a surrounding environment of the optical sensing device using the third laser beam; and
at least one photodetector configured to detect a returning laser beam reflected by an object in the surrounding environment,
wherein the PCB is formed in an L-shape with a first portion extending in a first direction and a second portion extending in a second direction perpendicular to the first direction,
wherein the first laser chip is disposed on the first portion such that the first polarized laser beam is emitted in a direction parallel to the second direction,
wherein the second laser chip is disposed on the second portion such that the second polarized laser beam is emitted in a direction parallel to the first direction, and
wherein the first and second laser chips are configured to generate the first and second polarized laser beams, respectively, at different time slots.

16. The optical sensing device of claim 15, wherein the first and second laser chips are turned on in the different time slots alternatively associated with respective duty cycles.

17. The optical sensing device of claim 16, wherein the duty cycles associated with the first and second laser chips respectively are roughly the same.

18. The optical sensing device of claim 15, wherein the PCB comprises a ceramic material.

* * * * *